United States Patent
Tang et al.

(10) Patent No.: US 7,629,815 B1
(45) Date of Patent: Dec. 8, 2009

(54) LOW-POWER SEMI-DYNAMIC FLIP-FLOP WITH SMART KEEPER

(75) Inventors: Bo Tang, Sunnyvale, CA (US); Ilyas Elkin, Sunnyvale, CA (US); Georgios K. Konstadinidis, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 12/180,441

(22) Filed: Jul. 25, 2008

(51) Int. Cl.
*H03K 19/20* (2006.01)

(52) U.S. Cl. .............................. 326/121; 326/93; 326/46

(58) Field of Classification Search .................... 326/46, 326/93–98, 112, 119, 121
See application file for complete search history.

(56) References Cited

U.S. PATENT DOCUMENTS

| | | | |
|---|---|---|---|
| 7,161,390 B2 * | 1/2007 | Aipperspach et al. ....... | 326/121 |
| 7,282,957 B2 * | 10/2007 | Sumita ......................... | 326/96 |
| 2003/0110404 A1 * | 6/2003 | Seningen et al. ............ | 713/320 |
| 2008/0106302 A1 * | 5/2008 | Sit et al. ...................... | 326/95 |

* cited by examiner

*Primary Examiner*—Don P Le
(74) *Attorney, Agent, or Firm*—Osha • Liang LLP

(57) ABSTRACT

A modified high-speed flip-flop including an input circuit, a smart window circuit, a smart keeper circuit, a pre-charge circuit, a discharge circuit, a slave storage circuit, and an output circuit. Additionally, a circuit including the modified high-speed flip-flop, the circuit also including a non-zero operating voltage provided to the flip-flop, a common voltage provided to the flip-flop, a clock signal input to the flip-flop, a data signal input to the flip-flop wherein the data signal has a high state and a low state, and an output signal from the flip-flop wherein the output signal has a high state and a low state.

12 Claims, 2 Drawing Sheets

LOW-POWER SEMI-DYNAMIC FLIP-FLOP WITH SMART KEEPER

BACKGROUND

Sequential logic circuits are two-valued networks that produce an output that is dependent on the present input and one or more past inputs. Thus, sequential logic circuits are useful in storing binary data. Sequential logic circuits are typically classified as either synchronous or asynchronous. The behavior of synchronous sequential logic circuits is determined by the state of one or more inputs at discrete instances of time, typically latched edges of a clocking source. In contrast, the behavior of asynchronous sequential logic circuits is determined by the state of one or more inputs at any given time without regard to the clocking source. Thus, synchronous sequential logic circuits require a clocking source to control the timing of changes to the output.

A conventional flip-flop circuit is a synchronous sequential logic circuit. As such, the flip-flop is useful in storing the equivalent of one bit of data. Flip-flops are typically distinguished by their respective characteristic equation. For a given flip-flop, the characteristic equation defines the next output in terms of the one or more current inputs and the current output. In this context, the term "current" refers to the present latched edge of the clocking source and the term "next" refers to the next latched edge of the clocking source.

A conventional Delay-type ("D-type") flip-flop includes an input data node, D, and an output data node, Q. The characteristic equation for the conventional D-type flip-flop is shown in Equation 1 below.

$$Q(t+1)=D(t) \qquad (1).$$

Thus, the output tracks the input by one latched edge of the clocking source.

In a conventional D-type flip-flop there are typically two voltage levels that govern the signaling states of the input and output. For the purposes of consistent notation, the states of the input and output are represented by Boolean values. The Boolean value "0" will represent the common or ground voltage. The Boolean value "1" will represent the operating voltage, a non-zero voltage that is process and design specific.

A truth table showing the behavior of the conventional D-type flip-flop is shown in Table 1 below.

TABLE 1

| D-type Flip-Flop | | |
| --- | --- | --- |
| D(t) | Q(t) | Q(t + 1) |
| 0 | 0 | 0 |
| 1 | 0 | 1 |
| 0 | 1 | 0 |
| 1 | 1 | 1 |

Time t represents the present time prior to latching the next edge of the clocking source. For example, Q(t) represents the present state of the output prior to latching the next edge of the clocking source. Q(t+1) represents the next state of the output one clock period later. Thus, the truth table implies that the next edge of the clock is latched between time t and t+1.

Returning to the example of the conventional D-type flip-flop, when the present input, D(t), is 0, and the present output, Q(t), is 0, the next output, Q(t+1), will also be 0. If the present input changes to a 1, the present output is still 0, however, the next output will be 1. If the present input changes back to a 0, the present output is now 1, and the next output will be 0. If the present input changes to a 1, the present output is still 1, and the next output will also be 1. Thus, the output is a delayed version of the input.

Because of the wide-applicability and pervasive use of the flip-flop, there is a great desire to optimize the flip-flop for use in modern applications, including high-speed microprocessor design.

SUMMARY

According to one aspect of one or more embodiments of the present invention, a modified high-speed flip-flop comprising: an input circuit; a smart window circuit; a smart keeper circuit; a pre-charge circuit; a discharge circuit; a slave storage circuit; and an output circuit.

According to one aspect of one or more embodiments of the present invention, a circuit comprising: a modified high-speed flip-flop comprising: an input circuit, a smart window circuit, a smart keeper circuit, a pre-charge circuit, a discharge circuit, a slave storage circuit, and an output circuit; a non-zero operating voltage provided to the flip-flop; a common voltage provided to the flip-flop; a clock signal input to the flip-flop; a data signal input to the flip-flop wherein the data signal has a high state and a low state; and an output signal from the flip-flop wherein the output signal has a high state and a low state; wherein the high state refers to the operating voltage and the low state refers to the common voltage.

Other aspects of the present invention will be apparent from the following description and the appended claims.

DETAILED DESCRIPTION

Figure 1:
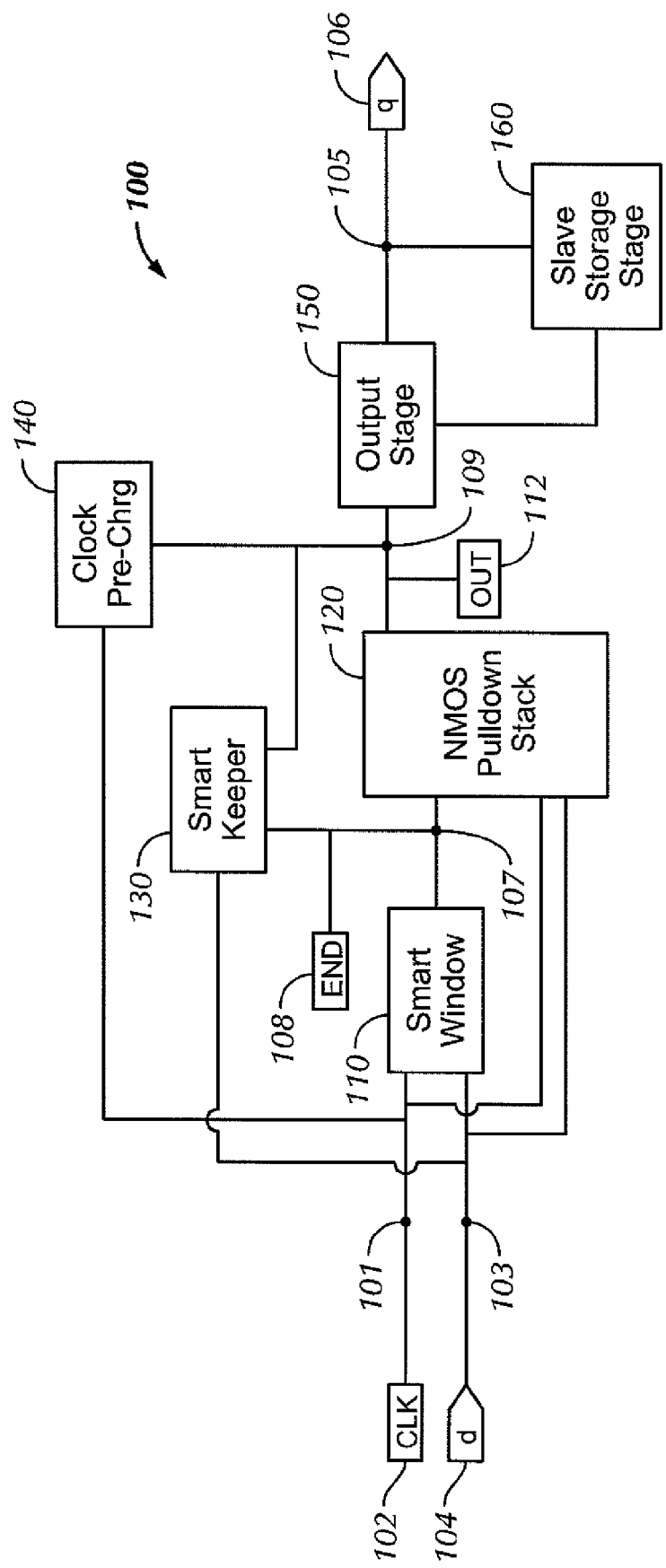
FIG. 1 shows a block diagram of a high-speed, low power, semi-dynamic flip-flop with a smart keeper in accordance with one or more embodiments of the present invention.

Specific embodiments of the present invention will now be described in detail with reference to the accompanying figures. Like elements in the various figures are denoted by like reference numerals for consistency. Further, in the following detailed description of embodiments of the present invention, numerous specific details are set forth in order to provide a more thorough understanding of the present invention. In other instances, well-known features have not been described in detail to avoid obscuring the description of embodiments of the present invention.

FIG. 1 is a block diagram of a high-speed, low power, semi-dynamic flip-flop with a smart keeper in accordance with one or more embodiments of the present invention.

A high-speed, low power, semi-dynamic flip-flop 100 is comprised of an input circuit comprising clock input node 101 and data input node 103, and an output circuit comprising output data node 105. The clock input node 101 inputs the clock ("clk") signal 102. The data input node 103 inputs the data ("d") signal 104. The output data node 105 outputs the data ("q") signal 106. In this case, the flip-flop 100 is a D-type flip-flop. One of ordinary skill in the art will recognize that, in terms of logical operation, the flip-flop 100 operates in accordance with the conventional D-type flip-flop described above.

Additionally, one of ordinary skill in the art will recognize that the use of the D-type flip-flop is merely exemplary and that similar results could be achieved with other types of flip-flops in accordance with one more embodiments of the present invention.

The flip-flop 100 is further comprised of a smart window 110, N-type Metal Oxide Semiconductor ("NMOS") pull down stack 120 (discharge circuit), smart keeper 130, dynamic clock pre-charge 140 (pre-charge circuit), output stage 150, and slave storage stage 160.

The nodal connectivity of the flip-flop 100 is described with respect to the constituent circuit blocks of the circuit. As discussed above, the input nodes are clock input node 101 and data input node 103. The output node is data output node 105. The clock input node 101 is also connected to the NMOS pull down stack 120 and the dynamic clock pre-charge 140. The data input node 103 is also connected to the NMOS pull down stack 120 and the smart keeper 130. The intermediate input node 107 connects the smart window 110, NMOS pull down stack 120, and smart keeper 130. The intermediate output node 109 connects the NMOS pull down stack 120, smart keeper 130, dynamic clock pre-charge 140, and output stage 150. One of ordinary skill in the art will recognize that flip-flop 100 includes additional nodes, whose description is not necessary for understanding of the present invention.

The operation of the flip-flop 100 is described with respect to the above noted nodes and the relevant related signals. The elk signal 102 is input to the smart window 110, NMOS pull down stack 120, and the clock pre-charge 140. The d signal 104 is input to the smart window 110, NMOS pull down stack 120, and the smart keeper 130.

The smart window 110 circuit provides for a self-adjusting and data selective evaluation window. The evaluation window is the time between a fifty percent mark of a rising edge of the elk signal 102 and a fifty percent mark of a rising edge of a delayed version of the elk signal 102, at intermediate input node 107. Note that when the d signal is a "0," intermediate input node 107 has a falling edge and when the d signal is a "1," intermediate input node 107 keeps its pre-charged "1." For this reason, the signal at the intermediate input node 107 is referred to as having a data dependent falling edge. As such, the smart window 110 determines when the d signal 104 is latched with respect to the clk signal 102 by dynamically controlling the width of the evaluation window. For the purposes of this discussion, the smart window 110 inputs the clk signal 102 and the d signal 104 and outputs intermediate ("end") signal 108 to the NMOS pull down stack 120.

The NMOS pull down stack 120 circuit discharges intermediate output node 109 to ground upon the assertion of the end signal 108 by the smart window 110. Once intermediate output node 109 is discharged, intermediate ("out") signal 112 is a "0."

The dynamic pre-charge 140 circuit pre-charges intermediate output node 109 to a "1" during the clock low phase of a given clock cycle.

The smart keeper 130 circuit operates free of contention with the NMOS pull down stack 120 at intermediate output node 109. The smart keeper 130 is controlled, in part, by the d signal 104 and the end signal 108. The smart keeper 130 is described in more detail below.

The output stage 150 outputs the q signal 106 in accordance with the input and the logical operation of the flip-flop 100. One of ordinary skill in the art will recognize that the output stage 150 may include one or more buffers or inverters, not shown, in accordance with one or more embodiments of the present invention.

The slave storage stage 160 will keep the captured d signal 104 inputted when the clk signal 102 is in the low phase, so that the output q 106 will not float.

Returning to the smart window 110, it provides for a self-adjusting and data selective evaluation window. As such, the smart window 110 determines when the d signal 104 is latched with respect to the clk signal 102 by dynamically controlling the width of the evaluation window. The smart window 110 provides for a longer evaluation window when the d signal 104 is a "1" that later transitions to a "0" and an infinite evaluation window when the d signal 104 is a "1" that remains a "1." In addition, the smart window 110 provides for a substantially shorter evaluation window when the d signal 104 is a "0."

Because the smart window 110 is adjustable and data selective, the evaluation window varies such that there is minimal hold time and increased efficiency. In addition, the smart window 110 prevents race conditions between the smart window 110 and the NMOS pull down stack 120 when the d signal 104 is a "1" because the window will not shut off until the discharge is complete.

One of ordinary skill in the art will recognize that the clk signal 102 is a sinusoidal clock signal with a duty cycle of approximately fifty percent. When the clk signal 102 is in the low phase, the dynamic clock pre-charge 140 pre-charges the intermediate output node 109 to a "1" and the smart window 130 pre-charges the intermediate input node 107 to a "1."

When the clk signal 102 enters the high phase, intermediate output node 109 is fully driven by the smart keeper 130 and never floated. During an evaluation window, if the d signal 104 is a "1," the intermediate output node 109 is discharged by the NMOS pull down stack 120 such that intermediate output node 109 discharges from a "1" to "0." Once intermediate output node 109 has discharged, the d signal 104 is free to change state. This is characterized as the d=1 hold time. During an evaluation window, if the d signal 104 is a "0," the smart keeper 130 provides a keeping force for intermediate output node 109 to remain a "1." Thus, the d signal 104 cannot change during the evaluation window. This is characterized as the d=0 hold time. After the evaluation window, the d signal 104 is free to change from a "0" to a "1."

Thus, the smart keeper 110 provides a keeping force for intermediate output node 109 to remain a "1" during the entire clk signal 102 high phase when the d signal 104 is a "0" at the clk signal 102 rising edge. When the incoming signal, the d signal 104, is a "1" during the evaluation window, intermediate output node 109 will be discharged from a "1" to a "0" without contention from the smart keeper 130 because the smart keeper 130 will be advantageously off. Because the contention is eliminated, the flip-flop is robust without concern about write-ability and allows for reduced power by the reduction in size of the constituent components of the NMOS pull down stack 120.

Figure 2:
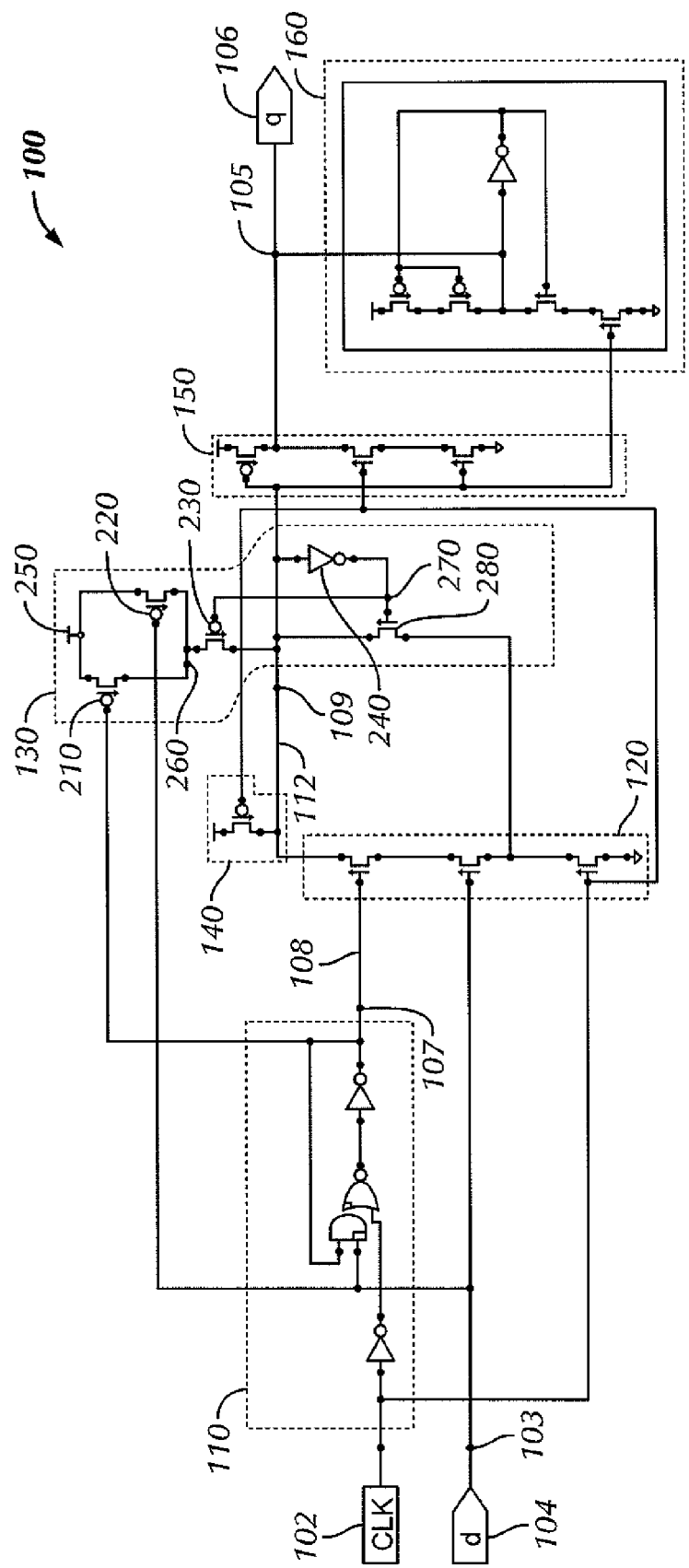
FIG. 2 shows a schematic diagram of a high-speed, low power, semi-dynamic flip-flop with a smart keeper in accordance with one or more embodiments of the present invention.

FIG. 2 is a schematic diagram of a high-speed, low power, semi-dynamic flip-flop with a smart keeper in accordance with one or more embodiments of the present invention.

One of ordinary skill in the art will recognize that, in terms of logical operation, the flip-flop 100 operates in accordance with the conventional D-type flip-flop described above. Further, one of ordinary skill in the art will recognize the independent circuit level operation of the smart window 110, NMOS pull down stack 120, clock pre-charge 140, output stage 150, and slave storage stage 160 from the schematic.

The smart keeper 130 is comprised of P-type Metal Oxide Semiconductor ("PMOS") field-effect transistor ("FET") 210, PMOS FET 220, PMOS FET 230, and inverter 240. In terms of nodal connectivity, the drain of PMOS FET 210 and PMOS FET 220 is connected to operating voltage 250. The source of PMOS FET 210 and PMOS FET 220 is connected to intermediate smart keeper node 260. The gate of PMOS FET 210 is connected to intermediate input node 107. The gate of PMOS FET 220 is connected the d signal 104. The drain of PMOS FET 230 is connected to intermediate smart keeper node 260. The source of PMOS FET 230 is connected to intermediate output node 109. The gate of PMOS FET 230 is connected to inverted intermediate output node 270.

When the clk signal 102 is in the low phase, the dynamic clock pre-charge 140 pre-charges the intermediate output node 109 to a "1" and the smart window 130 pre-charges the intermediate input node 107 to a "1." When the clk signal 102 enters the high phase, during the evaluation window, if the d signal 104 is a "1," the intermediate output node 109 is discharged by the NMOS pull down stack 120 such that intermediate output node 109 discharges from a "1" to "0." Once intermediate output node 109 has discharged, the d signal 104 is free to change state. This is characterized as the d=1 hold time. As such, the state of intermediate output node 109 will be kept by the smart keeper 130, specifically NMOS FET 280, during the evaluation window and after. During an evaluation window, if the d signal 104 is a "0," the state of the intermediate output node 109 is "1," fully driven by the smart keeper 130 during the window, and is continuously driven by the smart keeper 130 after the evaluation window. Thus, intermediate output node 109 is fully driven and never floated.

During an evaluation window, if the d signal 104 is a "0," the smart keeper 130 provides a keeping force for intermediate output node 109 to remain a "1." Specifically, PMOS FET 220 and PMOS FET 230 are on, which provides the above noted keeping force for intermediate output node 109. In this context, "on" means that the gate of the FET is driven to the appropriate voltage level such that the FET conducts current from the drain to the source. The magnitude of the current is the operating voltage of the FET divided by the drain to source resistance when the FET is on. The d signal 104 of "0" will propagate to intermediate input node 107. When intermediate input node 107 becomes "0," it will turn on PMOS FET 210. Thus, PMOS FET 210, PMOS PET 220, and PMOS FET 230 are all on, providing keeping force to intermediate output node 109. Thus, the d signal 104 cannot change during the evaluation window. This is characterized as the d=0 hold time.

After the evaluation window, the d signal 104 is free to change from a "0" to a "1." In this case, PMOS FET 220 is now off. However, intermediate output node 109 retains keeping force. The smart window 110, keeps intermediate input node 107 a "0," which turns on PMOS FET 210. Because PMOS FET 210, and PMOST FET 239 are both on, the intermediate output node 109 is kept at a "1" for the entire clock high phase, including during the evaluation window and after. Thus, intermediate output node 109 is always driven and never floated. One of ordinary skill in the art will recognize that floating nodes are subject to noise and leakage, especially in deep sub-micron process technology. Additionally, one of ordinary skill in the art will recognize that, for the reasons set forth above, principles of robust design disallow floating nodes.

Those skilled in the art, having the benefit of this detailed description, will appreciate that the high-speed, low power, semi-dynamic flip-flop with a smart keeper provides for a high-speed, low power flip-flop. Advantages of one or more embodiments of the present invention may include one or more of the following.

In one or more embodiments of the present invention, the high-speed, low power, semi-dynamic flip-flop with a smart keeper provides for reduced setup times (reduced hold times), resulting in faster operation.

In one or more embodiments of the present invention, the high-speed, low power, semi-dynamic flip-flop with a smart keeper is more robust because there are no floating nodes. Because there are no floating nodes, noise and transistor leakage are reduced, resulting in more robust operation and reduced power consumption.

In one or more embodiments of the present invention, the high-speed, low power, semi-dynamic flip-flop with a smart keeper provides for reduced power consumption because the NMOS transistors that comprise the NMOS pull down stack can be sized and scaled more aggressively to save power.

In one or more embodiments of the present invention, the high-speed, low power, semi-dynamic flip-flop with a smart keeper prevents noise that could inadvertently impact the stored state.

In one or more embodiments of the present invention, the high-speed, low power, semi-dynamic flip-flop with a smart keeper eliminates contention between the NMOS pull down stack and the smart keeper circuit at the intermediate output node.

While the invention has been described with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A modified high-speed flip-flop comprising:
   an input circuit;
   a smart window circuit;
   a smart keeper circuit;
   a pre-charge circuit;
   a discharge circuit;
   a slave storage circuit; and
   an output circuit.

2. The flip-flop of claim 1, wherein the smart keeper circuit provides a keeping force to maintain a non-zero node voltage at a node connecting the pre-charge circuit, discharge circuit, and output circuit.

3. The flip-flop of claim 2, wherein the smart keeper circuit prevents contention between the pre-charge circuit and discharge circuit because the common node is always driven and never floated.

4. The flip-flop of claim 3, wherein the power consumption of the flip-flop is reduced because a plurality of FETs used in the discharge circuit can be reduced in size and power consumption.

5. The flip-flop of claim 1, wherein the flip-flop is disposed in a semiconductor device.

6. The flip-flop of claim 1, wherein the flip-flop is disposed on a printed circuit board.

7. A circuit comprising:
   a modified high-speed flip-flop comprising:
      an input circuit,
      a smart window circuit,
      a smart keeper circuit,
      a pre-charge circuit,
      a discharge circuit,
      a slave storage circuit, and
      an output circuit;
   a non-zero operating voltage provided to the flip-flop;
   a common voltage provided to the flip-flop;

a clock signal input to the flip-flop;

a data signal input to the flip-flop wherein the data signal has a high state and a low state; and an output signal from the flip-flop wherein the output signal has a high state and a low state;

wherein the high state refers to the operating voltage and the low state refers to the common voltage.

8. The circuit of claim 7, wherein the smart keeper circuit provides a keeping force to maintain a non-zero node voltage at a node connecting the pre-charge circuit, discharge circuit, and output circuit.

9. The circuit of claim 8, wherein the smart keeper circuit prevents contention between the pre-charge circuit and discharge circuit because the node is always driven and never floated.

10. The circuit of claim 9, wherein the power consumption of the flip-flop is reduced because a plurality of FETs used in the discharge circuit can be reduced in size and power consumption.

11. The circuit of claim 7, wherein the flip-flop is disposed in a semiconductor device.

12. The circuit of claim 7, wherein the flip-flop is disposed on a printed circuit board.

* * * * *